United States Patent [19]

Oldham

[11] Patent Number: 5,039,872

[45] Date of Patent: Aug. 13, 1991

[54] DIGITALLY SYNTHESIZED AUDIO FREQUENCY VOLTAGE SOURCE

[75] Inventor: Nile M. Oldham, Ijamsville, Md.

[73] Assignee: The United States of America as represented by the Secretary of Commerce, Washington, D.C.

[21] Appl. No.: 414,213

[22] Filed: Sep. 28, 1989

[51] Int. Cl.$^5$ .................... H03K 5/00; H03B 19/00
[52] U.S. Cl. .................... 307/261; 307/271; 307/227; 328/14; 328/27; 328/186
[58] Field of Search .................... 328/14, 13, 27, 151, 328/186; 307/227, 261, 271, 260

[56] References Cited

U.S. PATENT DOCUMENTS

| | | | |
|---|---|---|---|
| 3,772,681 | 11/1973 | Skingle | 328/27 |
| 3,845,395 | 10/1974 | Murphree | 328/27 |
| 4,039,806 | 8/1977 | Fredriksson et al. | 328/14 |
| 4,306,190 | 12/1981 | Beckwith et al. | 328/14 |
| 4,814,637 | 3/1989 | Roessler et al. | 307/227 |

FOREIGN PATENT DOCUMENTS 0135437  3/1985  European Pat. Off. ............ 307/227

OTHER PUBLICATIONS

N. M. Oldham & P. S. Hetrick, "A Calculable, Transportable Audio-Frequency AC Reference Standard", IEEE Conf., 6/88.

Primary Examiner—Timothy P. Callahan
Attorney, Agent, or Firm—Alvin Englert

[57] ABSTRACT

A method and apparatus for accurately generating a digitally synthesized sinusoidal voltage is started by storing digital values for sine waveforms in a read only memory. A first and second digital to analog converters are connected to the read only memory through latches. The outputs of the first and second digital to analog converters are alternatively switched between the inverting input and the non-inverting input of an operational amplifier such that one of the first and second digital to analog converter is connected to the inverting input while the other is connected to the non-inverting input. The output of the operational amplifier is connected to the inverting input through a variable capacitance, the feedback being determined by the one of the first and second digital to analog converter connected to the inverting input. A clock is used to control the connection of the first and second digital to analog converter to the inverting input and to control the determination of the feedback.

7 Claims, 3 Drawing Sheets

DIGITALLY SYNTHESIZED AUDIO FREQUENCY VOLTAGE SOURCE

BACKGROUND OF THE INVENTION

1. Field of the Invention

The present invention pertains to voltage waveform generation systems and more particularly to the digital generation of synthetic alternating current voltage waveforms in the audio frequency range.

2. Related Prior Art

Digitally-synthesized sine-wave sources have become commonplace in metrology laboratories in recent years, particularly where a precise knowledge of the phase angle between two waveforms is re Impedance and power bridges, as well as phase angle rely on waveform synthesis techniques to achieve state-of-the-art accuracy. The approach has been applied to ac-voltage with some success; however, imperfections in the steps used to generate the waveforms have limited the ability to calculate the rms value of the ac signal based on a knowledge of the static voltage of each step. Transient energy due to waveform aberrations at the step transitions (often referred to as "glitches") adds to the signal power making it difficult to predict the rms value accurately.

SUMMARY OF THE INVENTION

The present invention provides a method and apparatus for accurately generating a digitally synthesized sinusoidal voltage which is started by storing digital values for sine waveforms in a read only memory. A first digital to analog converter is connected to the read only memory through a first latch. A second digital to analog converter is connected to the read only memory through a second latch. The output of the first digital to analog converter and the output of the second digital to analog converter is alternatively switched between the inverting input and the non-inverting input common of an operational amplifier such that the first digital to analog converter is connected to the inverting input while the second is connected to the non-inverting input. The output of the operational amplifier is connected to the inverting input through a variable capacitance, the feedback being determined by the digital to analog converter connected to the inverting input. A clock is used to control the connection of the first and second digital to analog converter to the inverting input and to control the determination of the feedback.

DESCRIPTION OF THE PREFERRED EMBODIMENT

A "deglitching" technique has been employed to enhance the step quality in an audio-frequency, digitally synthesized source (DSS). Charge-coupled and switching glitches, as well as current settling time in high-resolution digital-to-analog converters (DAC), may be reduced by toggling between two converters which are updated at different times.

Figure 1:
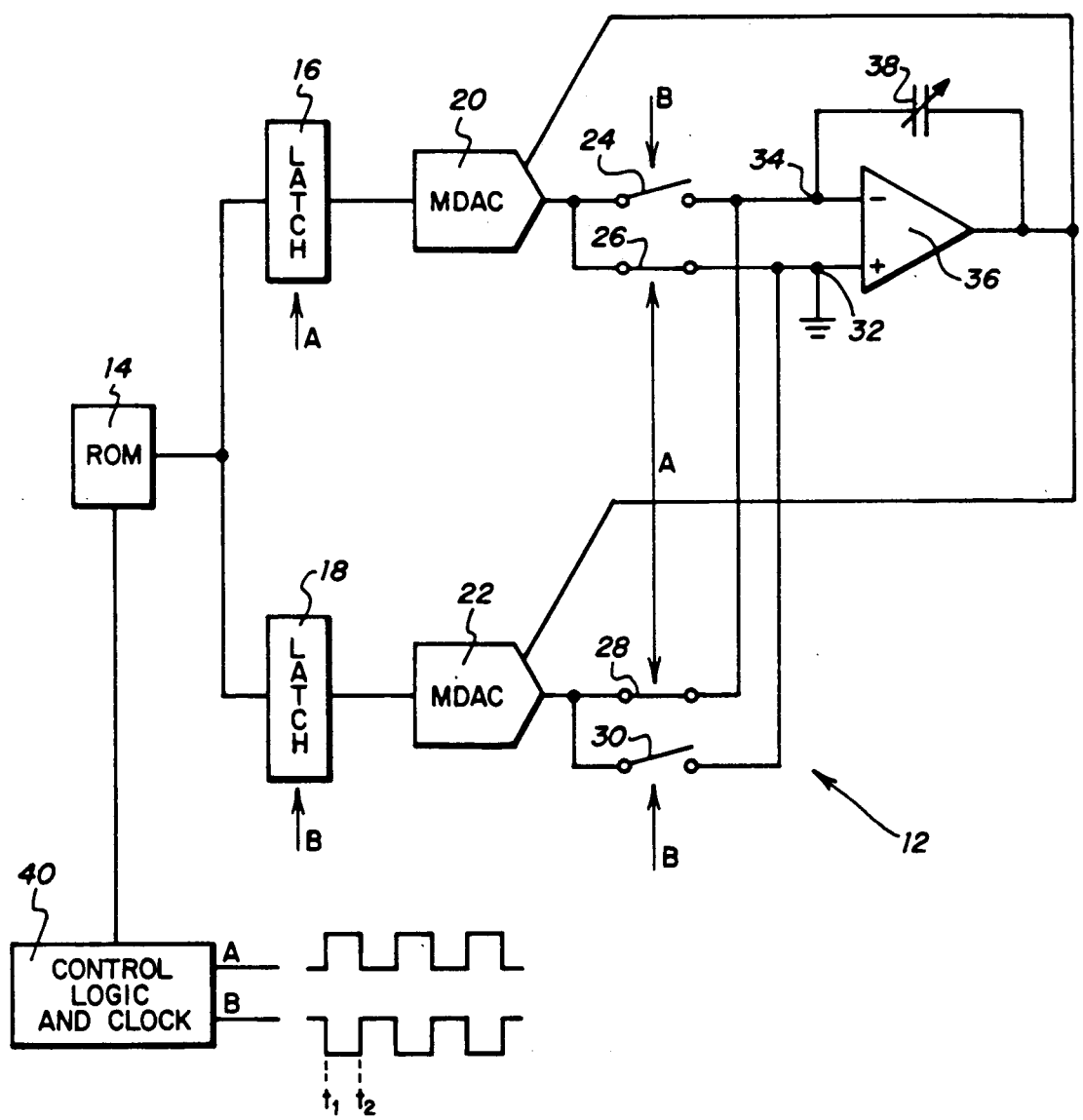
FIG. 1 is a schematic block diagram of a digitally synthesized voltage source.

A simplified diagram of the digitally synthesized source 12 of the present invention is shown in FIG. 1. Digital values of the waveform, stored in a read-only-memory (ROM) 14 are latched sequentially by latches 16 and 18 into multiplying digital to analog converters, MDAC 20 and MDAC 22, on the positive transition of clock signals A and B, respectively. Fast CMOS switches 24, 26, 28 and 30 steer the output current from each MDAC to ground 32 until the current step has settled, and then steer the current into the inverting input 34 of a wide band operational amplifier 36. At time $t_1$ new data is latched by latch 16 into MDAC 20, switches 26 and 28 are closed, and switches 24 and 30 are opened. While MDAC 20 is settling, MDAC 22 supplies the output step, and thus most of the transient energy generated by MDAC 20 is dissipated in the ground plane. At time $t_2$, new data is latched via latch 18 into MDAC 22, switches 24 and 30 are closed, and switches 26 and 28 are opened. MDAC 20 now supplies the output step while MDAC 22 is settling. Each MDAC 20 and 22 supplies half of the steps and thus operates at half of the clock rate, allowing the generator to operate at higher clock rates than would be possible with a single digital to analog converter.

The feedback path, from the amplifier output back to its inverting input, is determined by either MDAC 20 or 22, whichever is connected to the inverting input. In addition to the gain accuracy and temperature tracking realized by using the internal feedback resistor in each MDAC, this approach minimizes the effects of switch contact-resistance (inside the feedback loop the switch resistance is divided by the amplifier loop gain).

Figure 2:
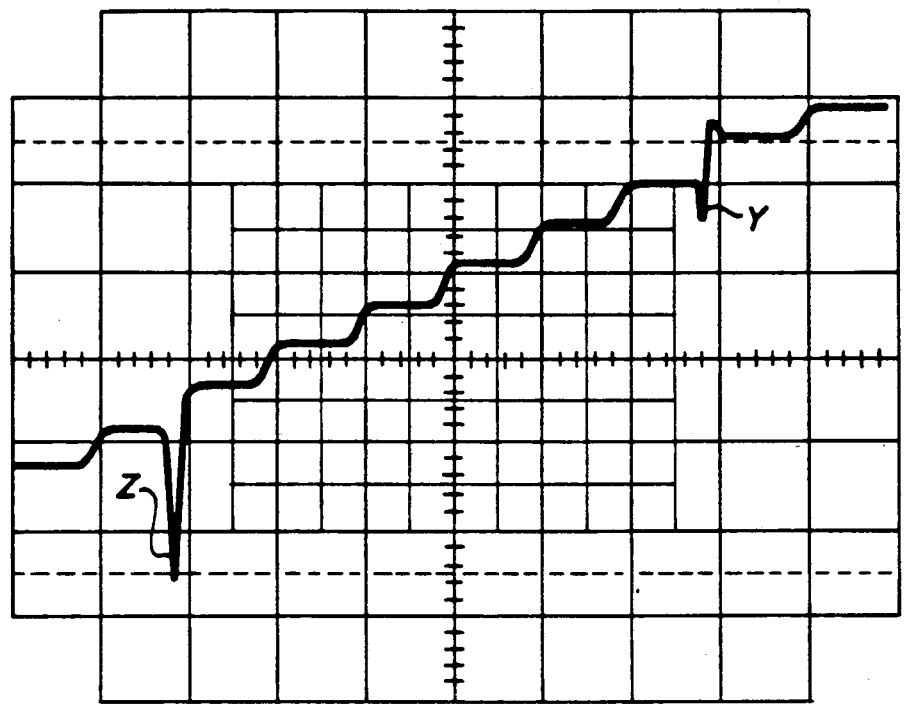
FIG. 2 is a graphical representation of a sine wave approximation generated using a single digital to analog converter.
Figure 3:
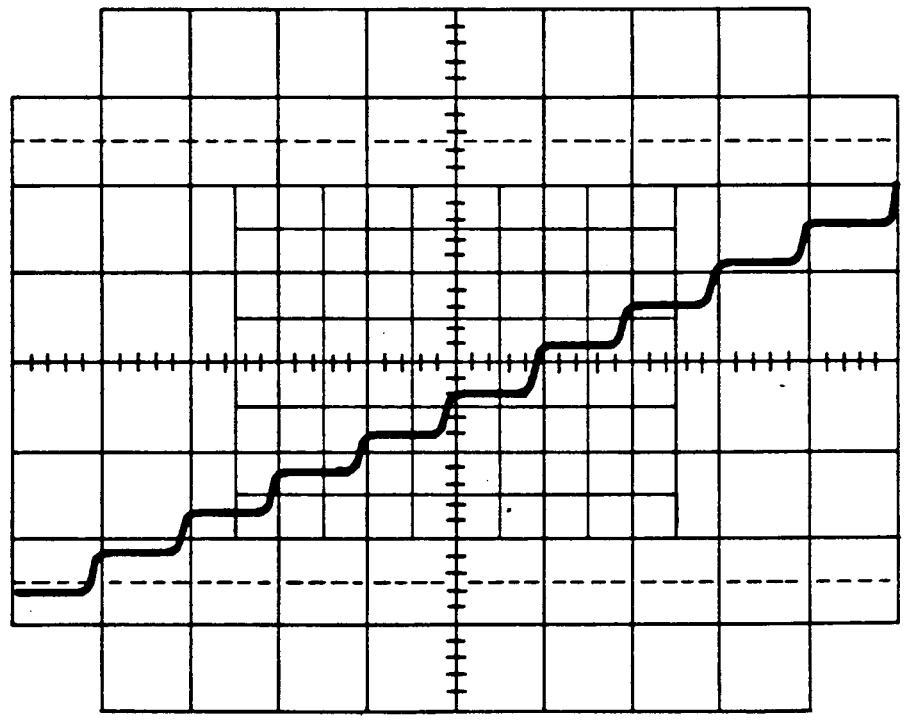
FIG. 3 is a graphical representation of a sine wave approximation using the digitally synthesized source of FIG. 1.

An oscilloscope trace of a portion of a one hundred twenty-eight step sine-wave approximation generated by a single digital to analog converter with a clock rate of 1 MHz is shown in FIG. 2. The corresponding waveform, generated by toggling two digital to analog converters, such as the present invention, into the same output stage, is shown in FIG. 3. The major transition glitch Z and glitch Y, as well as other structural differences between the steps in the single digital to analog converter system are virtually eliminated with the two digital to analog converter approach.

While the waveform in FIG. 3 is noticeably improved, the flatness of its rms (root mean squared) value vs. frequency is not well defined (at the ppm level) above about 2 kHz. The deglitching technique does not eliminate the effects of charge injection from the logic signals into the switches, timing skews in the switches and in the control signals, or amplifier errors (including overshoot, ringing, and slew limiting). In the frequency band from 2 to 15 kHz these effects tend to increase the rms value as the frequency is increased. By sacrificing frequency response, the amplifier can be band limited to flatten the rms gain to within ±10 ppm, well into the audio-frequency range. This trimming is done using a small variable capacitor 38, which shunts the feedback circuit of the output amplifier.

In the preferred embodiment of the present invention, digitally synthesized source 12 has been constructed using eighteen bit multiplying digital to analog converters as MDAC 20 and 22. For simplicity only the most-significant eight bits are used to synthesize the waveform. Eighteen-bit converters were selected to obtain the component stability and low temperature coefficients that are inherent in high-resolution digital to analog converters.

Digitally synthesized source 12 is normally operated using the internal ten volt dc reference in one of the multiplying digital to analog converters as a reference voltage for both multiplying digital to analog converters. The ten volt level produces a sine wave with an rms value of approximately seven volts. Any stable reference between zero and ten volts dc may be supplied externally to produce sine waves with rms values between zero and seven volts. However, it is to be noted that lower reference voltages may seriously degrade the performance.

An internal clock 40 provides a pulse, the rate of which may be selected in sixteen binary increments, which is used to generate one hundred twenty-eight step sine-wave approximations between 1 Hz to 15 kHz. However, digitally synthesized source 12 may be operated using an external clock (not shown) in order to obtain better frequency precision. The external clock may also be used in the step calibration mode described below.

The rms voltage generated by digitally synthesized source 12 is computed by stepping through ROM 14 at low speed to measure the amplitude of each step with a high-accuracy dc digital voltmeter (DVM). The rms value of the generated waveform using this "step calibration" is determined by computing the square-root of the mean value of the square of each of the measured step voltages:

$$V_{rms} = \left( \sum_{i=1}^{N} \frac{[v_i(1 + C)]^2}{N} \right)^{\frac{1}{2}}, \quad (1)$$

where
$V_i$=the voltage of the ith step,
N=number of steps in one period, and
C=DVM correction.

The uncertainty of the step calibration is a function of the gain and linearity errors of the digital voltmeter used to measure each step. To minimize gain errors, the digital voltmeter is calibrated immediately prior to the step calibration. The short-term stability of this calibration is critical, and is typically within +1 ppm during the test. The digital voltmeter linearity is also important since the computed rms value is based on measurements made at many different voltages. Integrating digital voltmeters with nonlinearities of less than two ppm of full scale are commercially available. The step calibration is automated by connecting the "conversion complete" digital output from the digital voltmeter to the external clock input of digital synthesizer source 12. The digital voltmeter may be connected to a desktop computer (not shown) via the IEEE-488 bus and a BASIC software routine may be used to compute the rms value. The short-term repeatability of the rms value computed by the step calibration is typically within one ppm.

A simplified step calibration, consisting of "offset" and "gain" measurements made at plus and minus full scale, has been used with linear single digital to analog converter generators. However, the nonlinearity of the dual digital to analog converters in digitally synthesized source 12 of the present invention can be quite large (a function of linearity, offset, and gain differences between MDAC 20 and 22), therefore the complete step calibration is required. The best multi-slope integrating digital voltmeters are typically an order of magnitude more linear than the best multiplying digital to analog converters and the complete step calibration should enhance the accuracy of single digital to analog converter generators as well.

The concept of a "calculable source", which relies on measurements of the dc level of each step, requires the waveform to have the same shape at all frequencies of interest. The rms value may be computed by equation (1) (or any other standard procedure for removing sampling harmonics) only if the staircase shape is not distorted by dynamic errors in the generation circuit or post filtering. Under ideal conditions, it can be shown that the rms value of the reconstructed sine wave is identical to the pure sinusoid from which the samples were obtained.

When a sinusoidal signal is approximated using digital synthesis, the fundamental frequency is mixed with the clock frequency to produce sampling harmonics that occur at the one hundred twenty-seventh, one hundred twenty-ninth, two hundred fifty-fifth, and two hundred fifty-seventh harmonics of the fundamental. In a perfect system there are an infinite number of sampling harmonics, the amplitudes of which are defined by:

$$V_i = \frac{V \sin (\pi F_i T)}{(\pi F_i T)} \quad (2)$$

where
V=peak amplitude of the ith harmonic of the fundamental,
V=peak amplitude of the "ideal" sine wave from which the samples were obtained,
$F_i$=frequency of the ith harmonic,
T=period of the clock frequency.

The amplitude of the fundamental component, $F_i$ of a reconstructed sine wave is also defined by (2). For a one hundred twenty-eight step sine wave, $V_1 = 0.999900$ V. The sampling harmonics thus deliver only one hundred ppm of the signal power (rms value), and it can be shown that less than three ppm of the signal power is delivered above the one thousand twenty-fifth harmonic of the fundamental. In practical terms, this means that an rms voltmeter with a bandwidth in excess of 1 MHz is required to measure an unfiltered, 1 kHz synthesized sine wave to an uncertainty of three ppm. In digitally synthesized source 12, frequency components above 10–20 MHz are eliminated by feedback capacitor 38 used to trim the rms response.

Additional distortion is caused by the quantization of each of the steps. The normalized magnitude of the quantization level is given by q=1/2n, where n is the number of effective bits in MDAC 20 and 22. Since only the most significant eight bits are used in digitally synthesized source 12, q=1/256. For eight bit quantization, the noise power ($P_n = q^2/12$) contributes less than plus or minus one ppm to the signal power.

The rms value, computed using the step calibration, has been compared to the thermally-measured value at sine wave frequencies between 30 Hz and 15 kHz. Thermal measurements, which represent the state-of-the-art, were made using an automatic voltage calibration system based on coaxial thermal voltage converters (TVC). This system is capable of measuring all of the harmonic power since its bandwidth is in excess of 100

MHz. Uncertainties associated with this measurement system are in the ac-dc difference of the TVC in the range of two ppm, lumped uncertainties due to the rest of the system also in the range of two ppm, and the standard deviation of the mean of fifteen observations in the range of one ppm.

To minimize dc uncertainties, the digital voltmeter used in the step calibration is calibrated by the dc source used as a reference for the thermal measurements. This source is thus considered the dc reference for both measurements.

The estimated standard deviations of the step and thermal calibrations were computed by $$U = \left( a^2 + \frac{(\Sigma b_i^2)}{3} \right)^{\frac{1}{2}}$$

where
a = standard deviation of the observations, and
b = limits of the estimated errors.

The resulting standard deviations are 1.6 ppm for the step calibration and 1.9 ppm for the thermal measurement.

Figure 4:
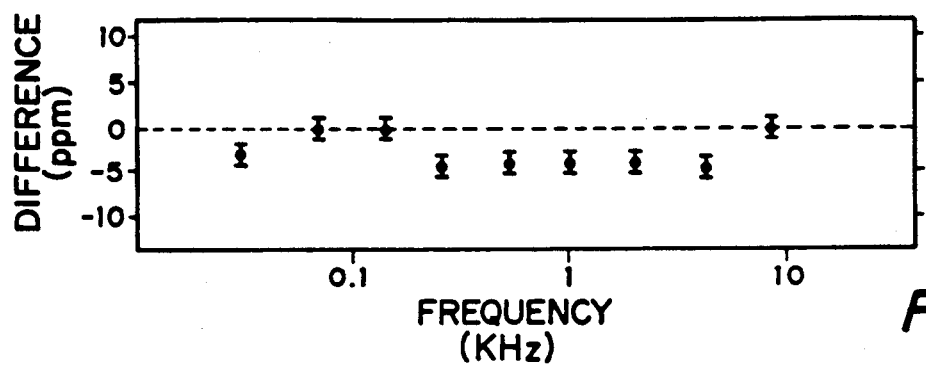
FIGS. 4–7 are graphical representations of the results of step and thermal measurements of the digitally synthesized voltage source of FIG. 1.
Figure 5:
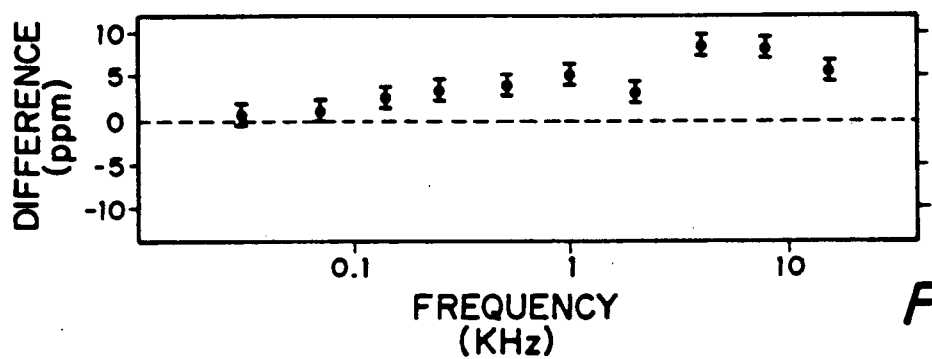
Figure 6:
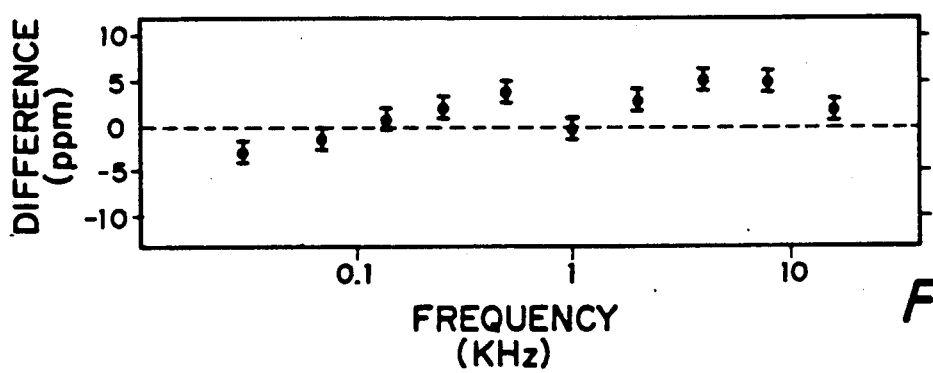
Figure 7:
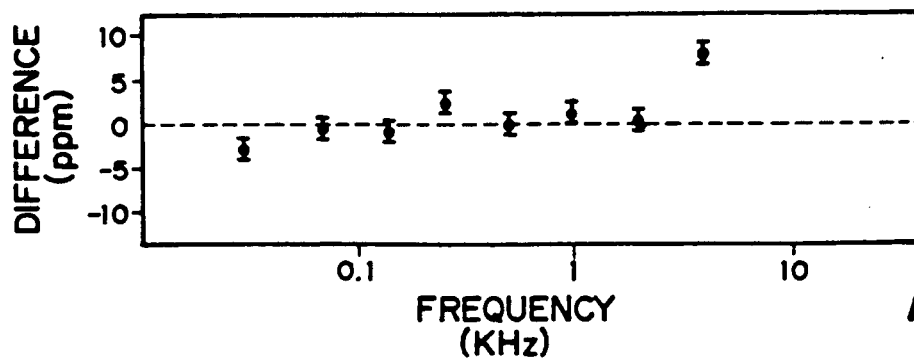

Results of step and thermal measurements of digitally synthesized source 12 are shown in FIGS. 4–7. To demonstrate the performance of different units under various operating conditions, two sources DSS1 and DSS2, (not shown) were measured using both internal and external clocks (not shown) to synthesize one hundred twenty-eight step sine wave approximations (FIGS. 4, 5 and 6). As a further demonstration, the results of measurements on a nonsinusoidal waveform (sine wave approximation with thirty percent third harmonic) are shown in FIG. 7. The plots show the average difference between three sets of measurements consisting of two step calibrations (represented by the dashed line) and five thermal measurements (plotted points with one-standard deviation error bars) at each frequency.

Agreement between the two methods is better than five ppm from 30 Hz to about 2 kHz. Above 2 kHz the rms value of digitally synthesized source 12 is less predictable, becoming increasingly dependent on the bandwidth adjustment described above. It was, however, possible to trim the rms value of DSS2 between 30 Hz and 15 kHz to within ten ppm of the calculated value. This "flatness" adjustment appears to be very stable vs. time and has proven to be relatively immune to normal mechanical shocks encountered during shipment.

In testing the preferred embodiment of the present invention, the rms value of a digitally synthesized waveform may be estimated by measuring the dc level of each of the steps used to generate the waveform. The accuracy of this estimate depends on the difference between the static and dynamic performance of the digital to analog converters MDAC 20 and 22. To minimize glitches caused by MDAC 20 and 22, due to charge injection and switching skews, a deglitching circuit which uses a fast switch, switches 24, 26, 28 and 30, to toggle between MDAC 20 and 22 is utilized. This circuit substantially improves the step quality while increasing the effective frequency range of the source.

The calculated rms value agrees with the thermally measured value to within five ppm from 30 Hz to 2 kHz. In this frequency range the digital-synthesis/calculation technique reenforces the validity of the traditional thermal approaches and may be considered as an independent dc-to-ac transfer standard. At higher frequencies, digitally synthesized sources are increasingly dependent on components, but it may be precisely adjusted so that the flatness of its rms value vs frequency is within ten ppm out to 15 kHz. With faster digital to analog converters used in place of MDAC 20 and 22, it should be possible to extend this performance to higher frequencies.

While the present invention has been described by way of a preferred embodiment, it is to be understood that this is for illustration purposes only and the present invention should not be limited thereto, but only by the scope of the following claims.

What is claimed is:

1. A digitally synthesized source for synthesizing a sinusoidal voltage waveform comprising:

a read only memory storing digital values representing sine waveforms;

clock means for generating first and second pulse trains such that while said first pulse train is high, said second pulse train is low and while said second pulse train is high, the first pulse train is low;

first latch means connected to said clock means and said read only memory and responsive to said first pulse train to provide as output digital values stored in said read only memory;

a first converter means connected to said first latch means for receiving and converting digital values stored in said read only memory into a first output current step signal in response to pulses of said first pulse train;

second latch means connected to said clock means and said read only memory and responsive to said second pulse train to provide as output digital values stored in said read only memory;

a second converter means connected to said second latch means for receiving and converting digital values stored in said read only memory into a second output current step signal in response to pulses of the second pulse train;

an operational amplifier having an inverting input, a non-inverting input and an output;

switch means for alternatively connecting said first converter means and said second converter means to said inverting input and said non-inverting input under control of said first and second pulse trains such that one of said first and said second current step signals is connected to said inverting input while the other is connected to said non-inverting input; and a feedback connection between said output and said inverting input of said operational amplifier through a variable capacitance, said variable capacitance being set to a low value for eliminating frequency components above 10–20 MHZ in the voltage waveform and for trimming a bandwidth of the operational amplifier so that a RMS value of the voltage waveform is flat within the audio-frequency range of the voltage waveform.

2. The digitally synthesized source according to claim 1 also including connector means for connecting said non-inverting input to ground.

3. The digitally synthesized source according to claim 1 wherein said switch means includes CMOS switches.

4. The digitally synthesized source according to claim 1 wherein said first and said second converter means includes a multiplying digital to analog converter.

5. The digitally synthesized source according to claim 1 wherein said clock means includes an internal clock.

6. The digitally synthesized source according to claim 1 wherein said clock means includes an external clock.

7. In a digitally synthesized alternating current voltage source for synthesizing a sinusoidal voltage waveform including a read only memory storing digital values representing sine waveforms; a first multiplying digital to analog converter connected to said read only memory through a first latch means; a second multiplying digital to analog converter connected to said read only memory through a second latch means; an operational amplifier having a inverting input, a non-inverting input and an output; switch means for alternatively connecting said first multiplying digital to analog converter and said second multiplying digital to analog converter to said inverting input and said non-inverting input such that one of said first multiplying digital to analog converter and said second multiplying digital to analog converter is connected to said inverting input while the other is connected to said non-inverting input; and clock means connected to said switch means for controlling connection of said first and second multiplying digital to analog converters to said inverting input; the improvement comprising:

a feedback connection between the output and the inverting input of said operational amplifier through a variable capacitor which is set to a low capacitance value for eliminating frequency components above 10-20 MHZ in the voltage waveform and to flatten the RMS gain of the voltage waveform within the audiofrequency range of the waveform.

* * * * *